(12) United States Patent
Wang et al.

(10) Patent No.: US 10,963,222 B2
(45) Date of Patent: Mar. 30, 2021

(54) TRUE RANDOM NUMBER GENERATOR WITH STABLE NODE VOLTAGE

(71) Applicant: Wenzhou University, Zhejiang (CN)

(72) Inventors: Pengjun Wang, Zhejiang (CN); Hongzhen Fang, Zhejiang (CN); Gang Li, Zhejiang (CN); Bo Chen, Zhejiang (CN)

(73) Assignee: Wenzhou University, Zhejiang (CN)

( * ) Notice: Subject to any disclaimer, the term of this patent is extended or adjusted under 35 U.S.C. 154(b) by 149 days.

(21) Appl. No.: 16/418,990

(22) Filed: May 21, 2019

(65) Prior Publication Data
US 2020/0042289 A1 Feb. 6, 2020

(30) Foreign Application Priority Data

Aug. 6, 2018 (CN) .......................... 201810883091.6

(51) Int. Cl.
*G06F 7/58* (2006.01)
*H03K 3/84* (2006.01)

(52) U.S. Cl.
CPC .............. *G06F 7/588* (2013.01); *H03K 3/84* (2013.01)

(58) Field of Classification Search
None
See application file for complete search history.

(56) References Cited

U.S. PATENT DOCUMENTS

| | | | | |
|---|---|---|---|---|
| 2010/0332574 | A1* | 12/2010 | Herbert ................. | H04L 9/0861 708/251 |
| 2012/0233231 | A1* | 9/2012 | Vasyltsov ............... | G06F 7/588 708/250 |
| 2015/0178048 | A1* | 6/2015 | Burleson ................ | G06F 7/588 708/255 |
| 2016/0202953 | A1* | 7/2016 | Chen ...................... | G06F 7/588 708/250 |

OTHER PUBLICATIONS

Sanu K. Mathew et al., "2.4 Gbps, 7 mW All-Digital PVT-Variation Tolerant True Random Number Generator for 45 nm CMOS High-Performance Microprocessors", IEEE Journal of Solid-State Circuits, vol. 47, No. 11, Nov. 2012, pp. 2807-2821.

* cited by examiner

*Primary Examiner* — Michael D. Yaary
(74) *Attorney, Agent, or Firm* — JCIP Global Inc.

(57) ABSTRACT

A true random number generator with stable node voltage comprises a loop control logic, two inverters identical in structure, two D flip-flops identical in structure, a first PMOS transistor, a second PMOS transistor, a first NMOS transistor, a monitoring module and a post-processing module. Each inverter comprises a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a tenth (Continued)

PMOS transistor and an eleventh PMOS transistor. The true random number generator has the advantages of being able to eliminate the capacitive coupling effect and has high randomness.

2 Claims, 5 Drawing Sheets

TRUE RANDOM NUMBER GENERATOR WITH STABLE NODE VOLTAGE

CROSS-REFERENCE TO RELATED APPLICATION

This application claims the priority benefit of China application serial no. 201810883091.6, filed on Aug. 6, 2018. The entirety of the above-mentioned patent application is hereby incorporated by reference herein and made a part of this specification.

TECHNICAL FIELD

The invention relates to a true random number generator, in particular to a true random number generator with stable node voltage.

DESCRIPTION OF RELATED ART

As for the design methods for bistable true random number generators, in Document 1 (Mathew S K, Srinivasan S, Anders M A, et al., 2.4 Gbps, 7 mW All-Digital PVT-Variation Tolerant True Random Number Generator for 45 nm CMOS High-Performance Microprocessors[J]. IEEE Journal of Solid-State Circuits, 2012, 47(11): 2807-2821), a true random number generator is implemented by the structure shown in FIG. 1. According to the true random number generator, a bistable circuit is formed by an inverter inv0 and an inverter inv1; when a clock signal CLK meets CLK=0, a charging switch is turned on, and node a and node b in the circuit are charged by a power supply VDD to a high level; when the clock signal CLK meets CLK=1, the charging switch is turned off, the voltages of node a and node b drop to a metastable potential (VDD/2) first, and then high-low levels are randomly output under the influence of thermal noise. In order to make sure that the circuit accurately enters into the metastable state under the condition of CLK=1, a negative feedback regulation structure involving a rough regulation stage and a fine regulation stage is adopted by the true random number generator: the inverter inv0 and the inverter inv1 are implemented by the structure shown in FIG. 2, a delay cell Delay0 and a delay cell Delay1 are implemented by the structure show in FIG. 3, random numbers output via node b are stored in a shift register formed by four D flip-flops A, B, C and D, a loop control logic (LCL) reads a 4-bit output sequence from the shift register every four clock cycles and generates a control signal according to the output sequence to configure the inverter inv0, the inverter inv1, the delay cell Delay0 and the delay cell Delay1 so as to compensate for process deviations and environmental changes. The true random number generator enters into the rough regulation stage first. Particularly, in the rough regulation stage, the loop control logic generates four 4-bit parallel control signals pconf0, nconf0, pconf1 and nconf1 to regulate the inverter inv0 and the inverter inv1 to eliminate large process deviations, so that output sequences are prevented from being 1 or 0 constantly, wherein nconf0 controls the discharging speed of node b, and nconf1 controls the discharging speed of node a, so that along with the increase of nconf0, the discharging speed of node b is increased, and node b has a larger probability to output potential 0; similarly, along with the increase of nconf1, node a has a larger probability to output potential 0; pconf0 controls the charging speed of node b, so that with the increase of pconf0, the charging speed of node b is increased, and node b has a larger probability to output potential 1; and similarly, pconf1 controls the charging speed of node a, so that with the increase of pconf1, the charging speed of node a is increased, and node a has a larger probability to output potential 1.

In this way, if the output sequence of the true random number generator in the initial state is constantly 1, the loop control logic sequentially generates control signals nconf1, nconf0, pconf1 and pconf0 to regulate the inverter inv0 and the inverter inv1 till the output sequence turns into 0 from 1 to complete rough regulation, and at this moment, the control signals nconf1, nconf0, pconf1 and pconf0 are maintained in the current state. If the output sequence of the true random number generator in the initial state is constantly 0, the loop control logic sequentially generates control signals nconf0, nconf1, pconf0 and pconf1 to regulate the inverter inv0 and the inverter inv1 till the output sequence turns into 1 from 0 to complete rough regulation, and at the moment, the control signals nconf0, nconf1, pconf0 and pconf1 are maintained in the current state. After rough regulation, the true random number generator enters into the fine regulation stage. Particularly, in the fine regulation stage, the loop control logic generates two 4-bit parallel control signals clkconf0 and clkconf1 to regulate the delay cell Delay0 and the delay cell Delay1, so that the probability of 0 and the probability of 1 of the output sequence are close to 50%, and accordingly, the randomness of the output sequence is improved. With the increase of clkconf1, the delay of the delay cell Delay1 is decreased, and the corresponding terminal has a larger probability to output potential 1; on the contrary, if the delay of the delay cell Delay1 is increased, the corresponding terminal has a larger probability to output potential 0. Similarly, with the increase of clkconf0, the delay of the delay cell Delay0 is decreased, and the corresponding terminal has a larger probability to output potential 1; on the contrary, if the delay of the delay cell Delay 0 is increased, the corresponding terminal has a larger probability to output potential 0. In the fine regulation stage, the loop control logic extracts 4-bit data from the shift register for detection every four clock cycles and then regulates the delay cell Delay0 and the delay cell Delay 1 according to the probabilities of 0 and 1, and thus, the true random number generator can operate within a high-entropy range.

The true random number generator has the following drawbacks: the inverter inv0 and the inverter inv1 are implemented by the structure shown in FIG. 2; in this inverter structure, if only the 4-bit parallel control signal pconf1 is turned on (namely pconf1=0000), the capacity of the inverter I1 to pull up node a will be improved theoretically, and in this case, node a has a larger probability to output '1', and node b has a larger probability to output '0'; however, under the capacitive coupling effect of this inverter structure, node a and node b will be simultaneously pulled to VDD at the arrival moment of the falling edge of CLK1 in the actual working process of the true random number generator, and the node voltage between every two connected PMOS transistors in the inverter I1 is always locked at VDD due to the fact that the 4-bit parallel control signal pconf1 is turned on; because the 4-bit parallel control signal pconf0 is not turned on, the node voltage between every two connected PMOS transistors in inverter I0 cannot be kept stable, downstream PMOS transistors will couple part of the voltage to the corresponding connection nodes due to the presence of the capacitance between the gate and the source, and consequentially, the voltages of the connection nodes in the inverter I0 are higher than the voltages of the corresponding connection nodes in the inverter I1, which means that the actual result is that node b has a larger probability to output '1' and is opposite to the theoretical result. Thus, actual outputs of the true random number generator are inconsistent with desired outputs, and the true random number generator is poor in randomness.

BRIEF SUMMARY OF THE INVENTION

The technical issue to be settled by the invention is to provide a high-randomness true random number generator with stable node voltage.

The technical solution adopted by the invention to settle the above technical issue is as follows: a true random number generator with stable node voltage comprises a loop control logic and two inverters identical in structure, wherein the loop control logic has an input terminal, a first output terminal, a second output terminal, a third output terminal and a fourth output terminal; the first output terminal of the loop control logic is used for outputting a first 4-bit parallel control signal, the second output terminal of the loop control logic is used for outputting a second 4-bit parallel control signal, the third output terminal of the loop control logic is used for outputting a third 4-bit parallel control signal, and the fourth output terminal of the loop control logic is used for outputting a fourth 4-bit parallel control signal; each inverter has an input terminal, an output terminal, a discharging terminal, a first control terminal, a second control terminal, a third control terminal, a fourth control terminal, a fifth control terminal, a sixth control terminal, a seventh control terminal and an eighth control terminal; the two inverters are called a first inverter and a second inverter; a first bit of the first 4-bit parallel control signal is accessed to the first control terminal of the first inverter, a second bit of the first 4-bit parallel control signal is accessed to the second control terminal of the first inverter, a third bit of the first 4-bit parallel control signal is accessed to the third control terminal of the first inverter, a fourth bit of the first 4-bit parallel control signal is accessed to the fourth control terminal of the first inverter, a first bit of the third 4-bit parallel control signal is accessed to the fifth control terminal of the first inverter, a second bit of the third 4-bit parallel control signal is accessed to the sixth control terminal of the first inverter, a third bit of the third 4-bit parallel control signal is accessed to the seventh control terminal of the first inverter, a fourth bit of the third 4-bit parallel control signal is accessed to the eighth control terminal of the first inverter, a first bit of the second 4-bit parallel control signal is accessed to the first control terminal of the second inverter, a second bit of the second 4-bit parallel control signal is accessed to the second control terminal of the second inverter, a third bit of the second 4-bit parallel control signal is accessed to the third control terminal of the second inverter, a fourth bit of the second 4-bit parallel control signal is accessed to the fourth control terminal of the second inverter, a first bit of the fourth 4-bit parallel control signal is accessed to the fifth control terminal of the second inverter, a second bit of the fourth 4-bit parallel control signal is accessed to the sixth control terminal of the second inverter, a third bit of the fourth 4-bit parallel control signal is accessed to the seventh control terminal of the second inverter, and a fourth bit of the fourth 4-bit parallel control signal is accessed to the eighth control terminal of the second inverter; the true random number generator further comprises two D flip-flops identical in structure, a first PMOS transistor, a second PMOS transistor, a first NMOS transistor, a monitoring module and a post-processing module; each D flip-flop has a clock terminal, an input terminal and an output terminal, the monitoring module and the post-processing module each have an input terminal and an output terminal, and the two D flip-flops are called a first D flip-flop and a second D flip-flop; the power supply is accessed to a source of the first PMOS transistor and a source of the second PMOS transistor; a gate of the first PMOS transistor, a gate of the second PMOS transistor and a gate of the first NMOS transistor are connected, and a corresponding connecting terminal is a first clock terminal of the true random number generator and allows a first clock signal to be accessed thereto; a drain of the first PMOS transistor, the input terminal of the first D flip-flop, the output terminal of the first inverter and the input terminal of the second inverter are connected; a drain of the second PMOS transistor, the input terminal of the second D flip-flop, the input terminal of the first inverter and the output terminal of the second inverter are connected; the discharging terminal of the first inverter, the discharging terminal of the second inverter and a drain of the first NMOS transistor are connected; a source of the first NMOS transistor is grounded; the input terminal of the first D flip-flop is an input terminal of the true random number generator; the clock terminal of the first D flip-flop and the clock terminal of the second D flip-flop are connected, and a corresponding connecting terminal is a second clock terminal of the true random number generator and allows a second clock signal to be accessed thereto; the cycle and amplitude of the second clock signal are the same as those of the first clock signal, and the phase of the second clock signal is delayed by a quarter of the cycle with respect to the first clock signal; the output terminal of the second D flip-flop is connected to the input terminal of the post-processing module and the input terminal of the monitoring module; the output terminal of the monitoring module is connected to the input terminal of the loop control logic; the output terminal of the second D flip-flop is used for generating an original random sequence, the monitoring module is used for periodically acquiring 4-bit data in the original random sequence, analyzing and calculating the probabilities of 0 and 1 in the 4-bit data to obtain a probability result and then sending the probability result to the loop control logic; the loop control logic generates corresponding control signals at the first input terminal, the second output terminal, the third output terminal and the fourth output terminal according to the probability result sent from the monitoring module to regulate the driving capacity of the first inverter and the second inverter; the original random sequence input to the post-processing module is subjected to bitxor processing by the post-processing module and is then output; each inverter comprises a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, a third PMOS transistor, a fourth PMOS transistor, a fifth PMOS transistor, a sixth PMOS transistors, a seventh PMOS transistor, an eighth PMOS transistor, a ninth PMOS transistor, a tenth PMOS transistor and an eleventh PMOS transistor; a gate of the second NMOS transistor, a gate of the third NMOS transistor, a gate of the fourth NMOS transistor, a gate of the fifth NMOS transistor, a gate of the sixth NMOS transistor, a gate of the third PMOS transistor, a gate of the eighth PMOS transistor, a gate of the ninth PMOS transistor, a gate of the tenth PMOS transistor and a gate of the eleventh PMOS transistor are connected, and a corresponding connecting terminal is the input terminal of the inverter; a drain of the second NMOS transistor, a drain of the seventh NMOS transistor, a drain of the eighth NMOS transistor, a drain of the ninth NMOS transistor, a drain of the tenth NMOS transistor, a drain of the third PMOS transistor, a drain of the fourth PMOS transistor, a drain of the fifth PMOS transistor, a drain of the sixth PMOS transistor and a drain of the seventh PMOS transistor are connected, and a corresponding connecting terminal is the output terminal of the inverter; a source of the second NMOS transistor, a source of the third NMOS transistor, a source of the fourth NMOS transistor, a source of the fifth NMOS transistor and a source of the sixth NMOS transistor are connected, and a corresponding connecting terminal is the discharging terminal of the inverter; a drain of the third NMOS transistor is connected to a source of the seventh NMOS transistor, a drain of the fourth NMOS transistor is connected to a source of the eighth NMOS transistor, a drain of the fifth NMOS transistor is connected to a source of the ninth NMOS transistor, a drain of the sixth NMOS transistor is connected to a source of the tenth NMOS transistor, a source of the fourth PMOS transistor is connected to a drain of the eighth PMOS transistor, a source of the fifth PMOS transistor is connected to a drain of the ninth PMOS transistor, a source of the sixth PMOS transistor is connected to a drain of the tenth PMOS transistor, a source of the seventh PMOS transistor is connected to a drain of the eleventh PMOS transistor, a gate of the seventh NMOS transistor is the first control terminal of the inverter, a gate of the eighth NMOS transistor is the second control terminal of the inverter, a gate of the ninth NMOS transistor is the third control terminal of the inverter, a gate of the tenth NMOS transistor is the fourth control terminal of the inverter, a gate of the fourth PMOS transistor is the fifth control terminal of the inverter, a gate of the fifth PMOS transistor is the sixth control terminal of the inverter, a gate of the sixth PMOS transistor is the seventh control terminal of the inverter, a gate of the seventh PMOS transistor is the eighth control terminal of the inverter, and the power supply is accessed to a source of the third PMOS transistor, a source of the eighth PMOS transistor, a source of the ninth PMOS transistor, a source of the tenth PMOS transistor and a source of the eleventh PMOS transistor; when the true random number generator works, if the first clock signal is at a low level, the first PMOS transistor and the second PMOS transistor are turned on, the first NMOS transistor is turned off, and at this moment, the voltage of a connection node of the drain of the first PMOS transistor, the input terminal of the first D flip-flop, the output terminal of the first inverter and the input terminal of the second inverter and the voltage of a connection node of the drain of the second PMOS transistor, the input terminal of the second D flip-flop, the output terminal of the second inverter and the input terminal of the first inverter are increased by the first PMOS transistor and the second PMOS transistor to the power voltage; if the first clock signal is at a high level, the first PMOS transistor and the second PMOS transistor are turned off, the first NMOS transistor is turned on, at this moment, the voltage of the connection node of the drain of the first PMOS transistor, the input terminal of the first D flip-flop, the output terminal of the first inverter and the input terminal of the second inverter and the voltage of the connection node of the drain of the second PMOS transistor, the input terminal of the second D flip-flop, the output terminal of the second inverter and the input terminal of the first inverter start to be decreased by the first NMOS transistor, and accordingly, the second D flip-flop acquires and generates an original random sequence and then outputs the original random sequence.

The width-to-length ratio of the second NMOS transistor is 10, the width-to-length ratio of the third NMOS transistor is 0.3, the width-to-length ratio of the fourth NMOS transistor is 0.4, the width-to-length ratio of the fifth transistor is 0.8, the width-to-length ratio of the sixth NMOS transistor is 1.6, the width-to-length ratio of the seventh NMOS transistor is 0.3, the width-to-length ratio of the eighth NMOS transistor is 0.4, the width-to-length ratio of the ninth NMOS transistor is 0.8, the width-to-length ratio of the tenth NMOS transistor is 1.6, the width-to-length ratio of the third PMOS transistor is 15, the width-to-length ratio of the fourth PMOS transistor is 0.4, the width-to-length ratio of the fifth PMOS transistor is 0.5, the width-to-length ratio of the sixth PMOS transistor is 1, the width-to-length ratio of the seventh PMOS transistor is 2, the width-to-length ratio of the eighth PMOS transistor is 0.4, the width-to-length ratio of the ninth PMOS transistor is 0.5, the width-to-length ratio of the tenth PMOS transistor is 1, and the width-to-length ratio of the eleventh PMOS transistor is 2.

Compared with the prior art, the invention has the following advantages: the monitoring module periodically acquires 4-bit data in an original random sequence generated by the second D flip-flop, the probabilities of 0 and 1 in the 4-bit data are analyzed and calculated to obtain a probability calculation result, then the probability calculation result is sent to the loop control logic, the loop control logic generates corresponding control signals at the first output terminal, the second output terminal, the third output terminal and the fourth output terminal according to the probability calculation result sent from the monitoring module to regulate the driving capacity of the first inverter and the second inverter, and the original random sequence input to the post-processing module is subjected to bitxor processing by the post-processing module and is then output; each inverter is formed by a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a tenth PMOS transistor and an eleventh PMOS transistor; when the true random number generator works, if the first clock signal is at a low level, the first PMOS transistor and the second PMOS transistor are turned on, the first NMOS transistor is turned off, and at this moment, the voltage of the drain of the first PMOS transistor, the input terminal of the first D flip-flop, the output terminal of the first inverter and the input terminal of the second inverter and the voltage of a connection node of the drain of the second PMOS transistor, the input terminal of the second D flip-flop, the output terminal of the second inverter and the input terminal of the first inverter are increased by the first PMOS transistor and the second PMOS transistor to the power voltage; and if the first clock signal is at a high level, the first PMOS transistor and the second PMOS transistor are turned off, the first NMOS transistor is turned on, at this moment, the voltage of the connection node of the drain of the first PMOS transistor, the input terminal of the first D flip-flop, the output terminal of the first inverter and the input terminal of the second inverter and the voltage of the connection node of the drain of the second PMOS transistor, the input terminal of the second D flip-flop, the output terminal of the second inverter and the input terminal of the first inverter start to be decreased by the first NMOS transistor, and accordingly, the second D flip-flop acquires and generates the original random sequence and then outputs the original random sequence. According to the true random number generator, when the second 4-bit control signal pconf1 generated by the loop control logic meets pconf1=0000, the voltage of a connection node between the drain of the fourth PMOS transistor and the source of the eighth PMOS transistor, the voltage of a connection node between the drain of the fifth PMOS transistor and the source of the ninth PMOS transistor, the voltage of a connection node between the drain of the sixth PMOS transistor and the source of the tenth PMOS transistor and the voltage of the connection node between the drain of the seventh PMOS transistor and the source of the eleventh PMOS transistor in the second inverter are kept stable and are not higher than the voltage of a connection node between the drain of the fourth PMOS transistor and the source of the eighth PMOS transistor, the voltage of a connection node between the drain of the fifth PMOS transistor and the source of the ninth PMOS transistor, the voltage of a connection node between the drain of the sixth PMOS transistor and the source of the tenth PMOS transistor and the voltage of a connection node between the drain of the seventh PMOS transistor and the source of the eleventh PMOS transistor in the first inverter, so that the first inverter and the second inverter have the expected driving capacity under a specific configuration, the capacitive coupling effect is eliminated, and thus, the randomness of the whole system is improved.

DETAILED DESCRIPTION OF THE INVENTION

The invention is further expounded below with reference to the accompanying drawings and embodiments.

Embodiment 1

Figure 1:
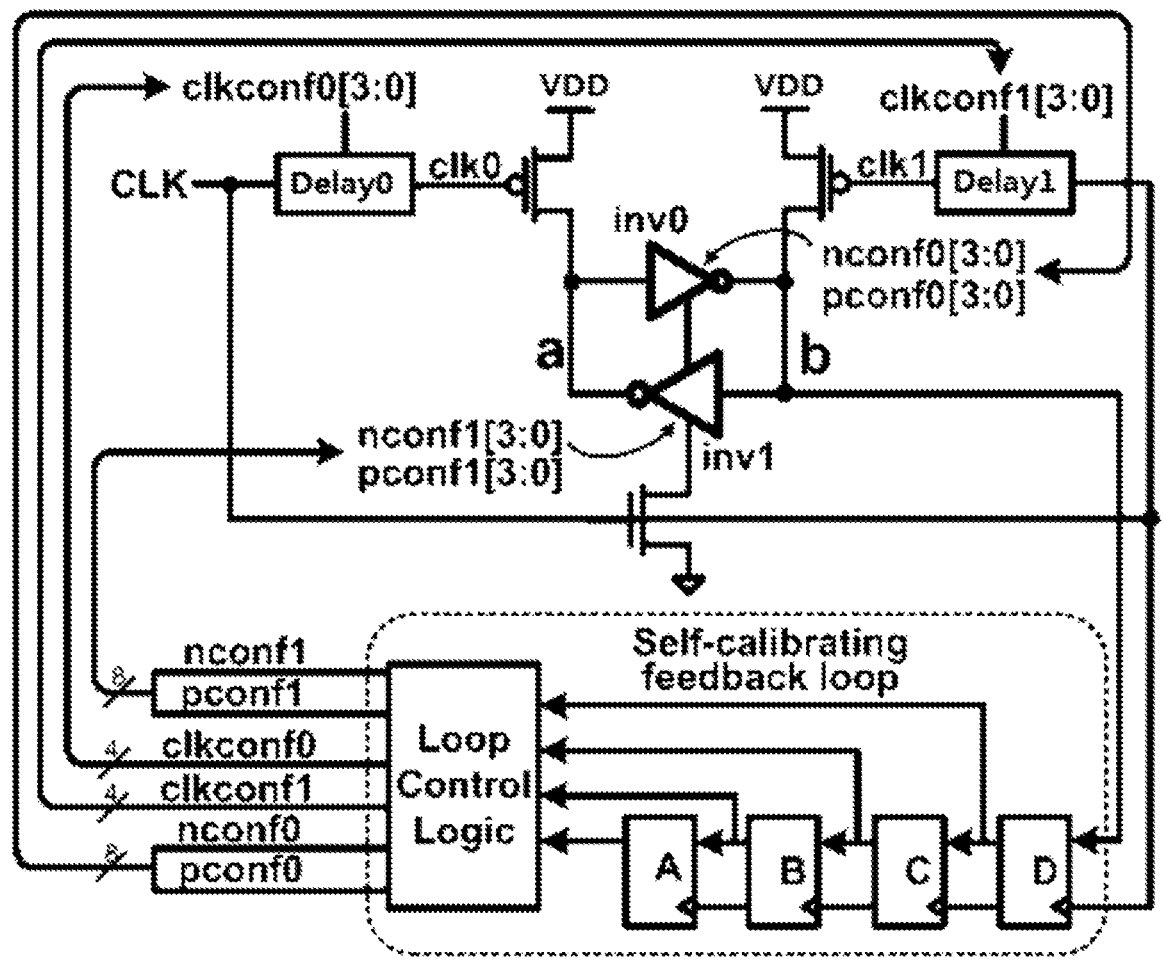
FIG. 1 is a structural view of an existing true random number generator.
Figure 2:
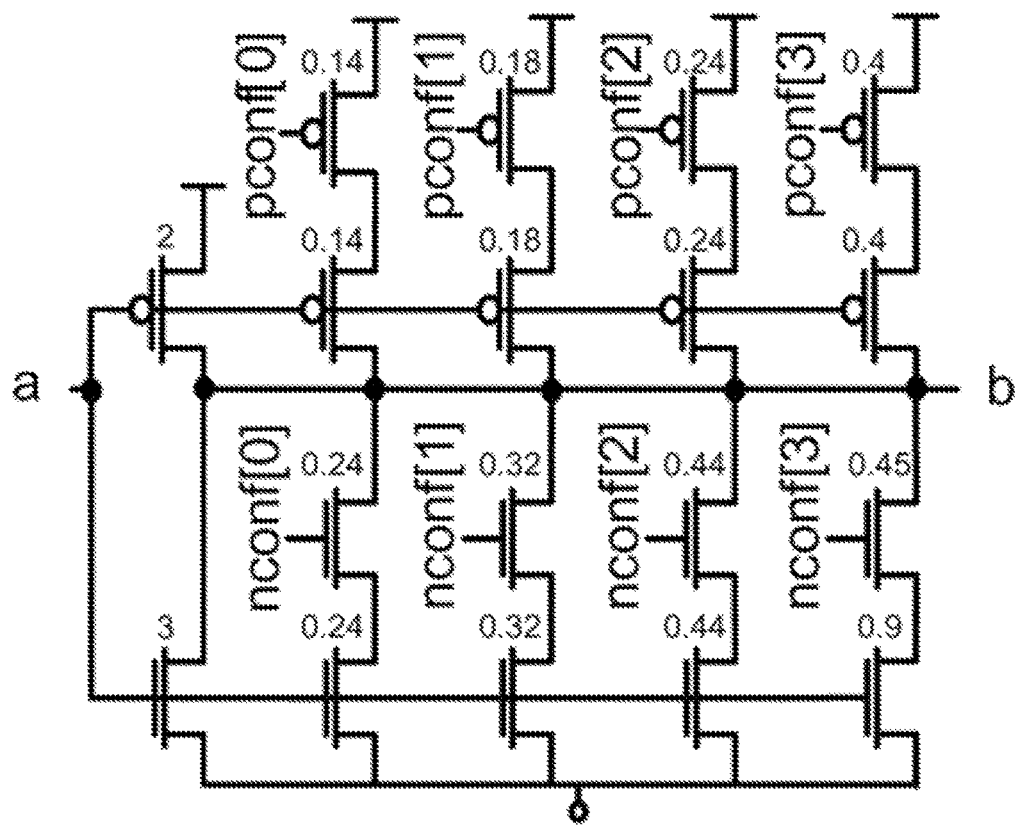
FIG. 2 is a structural view of inverters of the existing true random number generator.
Figure 3:
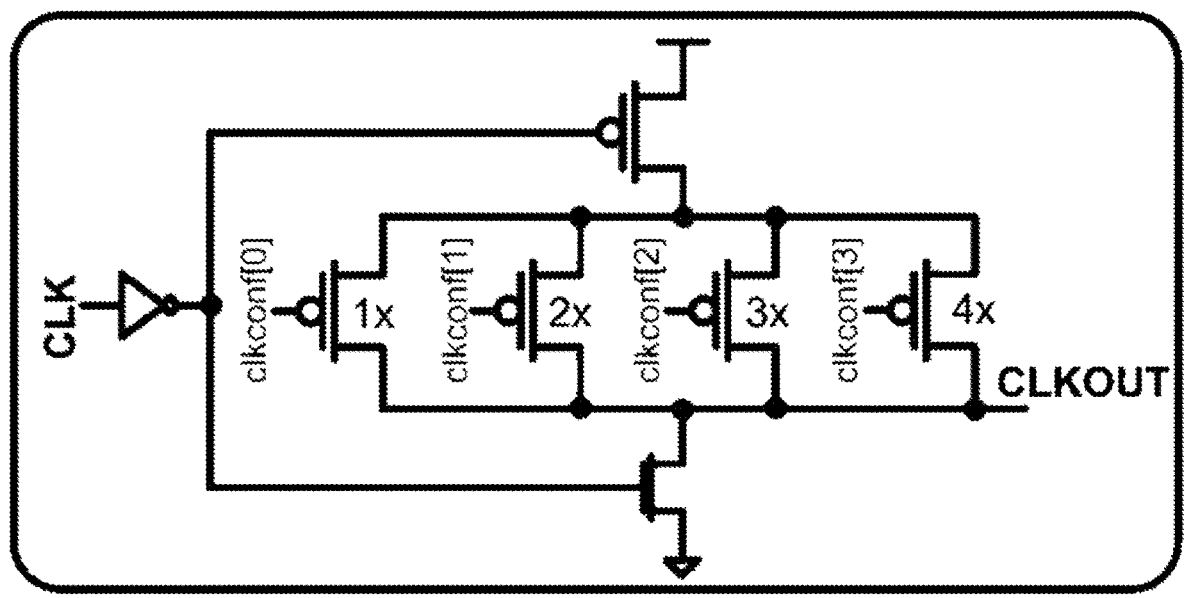
FIG. 3 is a structural view of a delay cell of the existing true random number generator.
Figure 4:
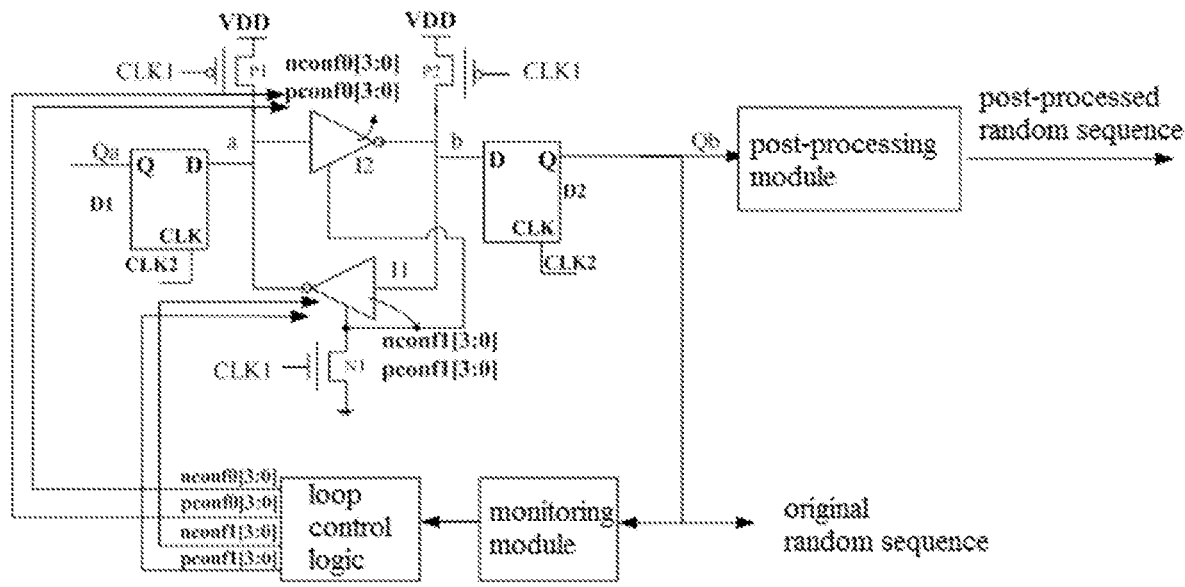
FIG. 4 is a structural view of a true random number generator of the invention.
Figure 5:
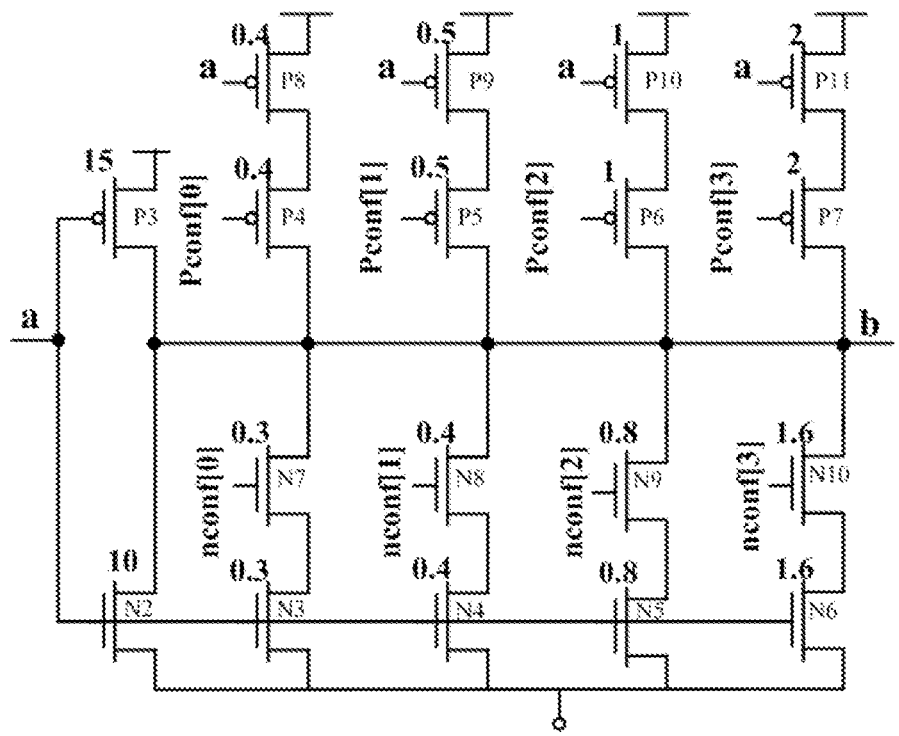
FIG. 5 is a circuit diagram of inverters of the true random number generator of the invention.

As shown in FIG. 4, a true random number generator with stable node voltage comprises and two inverters identical in structure. The loop control logic has an input terminal, a first output terminal, a second output terminal, a third output terminal and a fourth output terminal. The first output terminal of the loop control logic is used for outputting a first 4-bit parallel control signal nconf0[3:0]. The second output terminal of the loop control logic is used for outputting a second 4-bit parallel control signal pconf0[3:0]. The third output terminal of the loop control logic is used for outputting a third 4-bit parallel control signal nconf1[3:0]. The fourth output terminal of the loop control logic is used for outputting a fourth 4-bit parallel control signal pconf1[3:0]. Each inverter has an input terminal, an output terminal, a discharging terminal, a first control terminal, a second control terminal, a third control terminal, a fourth control terminal, a fifth control terminal, a sixth control terminal, a seventh control terminal and an eighth control terminal. The two inverters are called a first inverter I1 and a second inverter I2. A first bit of the first 4-bit parallel control signal nconf0[3:0] is accessed to the first control terminal of the first inverter I1. A second bit of the first 4-bit parallel control signal nconf0[3:0] is accessed to the second control terminal of the first inverter I1. A third bit of the first 4-bit parallel control signal nconf0[3:0] is accessed to the third control terminal of the first inverter I1. A fourth bit of the first 4-bit parallel control signal nconf0[3:0] is accessed to the fourth control terminal of the first inverter I1. A first bit of the third 4-bit parallel control signal nconf1 [3:0] is accessed to the fifth control terminal of the first inverter I1. A second bit of the third 4-bit parallel control signal nconf1 [3:0] is accessed to the sixth control terminal of the first inverter I1. A third bit of the third 4-bit parallel control signal nconf1 [3:0] is accessed to the seventh control terminal of the first inverter I1. A fourth bit of the third 4-bit parallel control signal nconf1 [3:0] is accessed to the eighth control terminal of the first inverter I1. A first bit of the second 4-bit parallel control signal pconf0[3:0] is accessed to the first control terminal of the second inverter I2. A second bit of the second 4-bit parallel control signal pconf0[3:0] is accessed to the second control terminal of the second inverter I2. A third bit of the second 4-bit parallel control signal pconf0[3:0] is accessed to the third control terminal of the second inverter I2. A fourth bit of the second 4-bit parallel control signal pconf0 [3:0] is accessed to the fourth control terminal of the second inverter I2. A first bit of the fourth 4-bit parallel control signal pconf1 [3:0] is accessed to the fifth control terminal of the second inverter I2. A second bit of the fourth 4-bit parallel control signal pconf1 [3:0] is accessed to the sixth control terminal of the second inverter I2. A third bit of the fourth 4-bit parallel control signal pconf1 [3:0] is accessed to the seventh control terminal of the second inverter I2. A fourth bit of the fourth 4-bit parallel control signal pconf1 [3:0] is accessed to the eighth control terminal of the second inverter I2. The true random number generator further comprises two D flip-flops identical in structure, a first PMOS transistor P1, a second PMOS transistor P2, a first NMOS transistor N1, a monitoring module and a post-processing module. Each D flip-flop has a clock terminal, an input terminal and an output terminal. The monitoring module and the post-processing module each have an input terminal and an output terminal. The two D flip-flops are called a first D flip-flop D1 and a second D flip-flop D2. A power supply is accessed to a source of the first PMOS transistor P1 and a source of the second PMOS transistor P2.

A gate of the first PMOS transistor P1, a gate of the second PMOS transistor P2 and a gate of the first NMOS transistor N1 are connected, and a corresponding connecting terminal is a first clock terminal of the true random number generator and allows a first clock signal CLK1 to be accessed thereto. A drain of the first PMOS transistor P1, the input terminal of the first D flip-flop D1, the output terminal of the first inverter I1 and the input terminal of the second inverter I2 are connected. A drain of the second PMOS transistor P2, the input terminal of the second D flip-flop D2, the input terminal of the first inverter I1 and the output terminal of the second inverter I2 are connected. The discharging terminal of the first inverter I1, the discharging terminal of the second inverter I2 and a drain of the first NMOS transistor N1 are connected. A source of the first NMOS transistor N1 is grounded. The input terminal of the first D flip-flop D1 is an input terminal of the true random number generator. The clock terminal of the first D flip-flop D1 and the clock terminal of the second D flip-flop D2 are connected, and a corresponding connecting terminal is a second clock terminal of the true random number generator and allows a second clock signal CLK2 to be accessed thereto. The cycle and amplitude of the second clock signal CLK2 are the same as those of the first clock signal CLK1. The phase of the second clock signal CLK2 is delayed by a quarter of the cycle with respect to the first clock signal CLK1. The output terminal of the second D flip-flop D2 is connected to the input terminal of the post-processing module and the input terminal of the monitoring module. The output terminal of the monitoring module is connected to the input terminal of the loop control logic. The output terminal of the second D flip-flop D2 is used for generating an original random sequence. The monitoring module is used for periodically acquiring 4-bit data in the original random sequence, analyzing and calculating the probabilities of 0 and 1 in the 4-bit data to obtain a probability result and then sending the probability result to the loop control logic. The loop control logic generates corresponding control signals at the first output terminal, the second output terminal, the third output terminal and the fourth output terminal according to the probability result sent from the monitoring module to regulate the driving capacity of the first inverter I1 and the second inverter I2. The original random sequence input to the post-processing module is subjected to bitxor processing by the post-processing module and is then output. Each inverter comprises a second NMOS transistor N2, a third NMOS transistor N3, a fourth NMOS transistor N4, a fifth NMOS transistor N5, a sixth NMOS transistor N6, a seventh NMOS transistor N7, an eighth NMOS transistor N8, a ninth NMOS transistor N9, a tenth NMOS transistor N10, a third PMOS transistor P3, a fourth PMOS transistor P4, a fifth PMOS transistor P5, a sixth PMOS transistor P6, a seventh PMOS transistor P7, an eighth PMOS transistor P8, a ninth PMOS transistor P9, a tenth PMOS transistor P10 and an eleventh PMOS transistor P11. A gate of the second NMOS transistor N2, a gate of the third NMOS transistor N3, a gate of the fourth NMOS transistor N4, a gate of the fifth NMOS transistor N5, a gate of the sixth NMOS transistor N6, a gate of the third PMOS transistor P3, a gate of the eighth PMOS transistor P8, a gate of the ninth PMOS transistor P9, a gate of the tenth PMOS transistor P10 and a gate of the eleventh PMOS transistor P11 are connected, and a corresponding connecting terminal is the input terminal of the inverter; a drain of the second NMOS transistor N2, a drain of the seventh NMOS transistor N7, a drain of the eighth NMOS transistor N8, a drain of the ninth NMOS transistor N9, a drain of the tenth NMOS transistor N10, a drain of the third PMOS transistor P3, a drain of the fourth PMOS transistor P4, a drain of the fifth PMOS transistor P5, a drain of the sixth PMOS transistor P6 and a drain of the seventh PMOS transistor P7 are connected, and a corresponding connecting terminal is the output terminal of the inverter; a source of the second NMOS transistor N2, a source of the third NMOS transistor N3, a source of the fourth NMOS transistor N4, a source of the fifth NMOS transistor N5 and a source of the sixth NMOS transistor N6 are connected, and a corresponding connecting terminal is the discharging terminal of the inverter; a drain of the third NMOS transistor N3 is connected to a source of the seventh NMOS transistor N7, a drain of the fourth NMOS transistor N4 is connected to a source of the eighth NMOS transistor N8, a drain of the fifth NMOS transistor N5 is connected to a source of the ninth NMOS transistor N9, a drain of the sixth NMOS transistor N6 is connected to a source of the tenth NMOS transistor N10, a source of the fourth PMOS transistor P4 is connected to a drain of the eighth PMOS transistor P8, a source of the fifth PMOS transistor P5 is connected to a drain of the ninth PMOS transistor P9, a source of the sixth PMOS transistor P6 is connected to a drain of the tenth PMOS transistor P10, a source of the seventh PMOS transistor P7 is connected to a drain of the eleventh PMOS transistor P11, a gate of the seventh NMOS transistor N7 is the first control terminal of the inverter, a gate of the eighth NMOS transistor N8 is the second control terminal of the inverter, a gate of the ninth NMOS transistor N9 is the third control terminal of the inverter, a gate of the tenth NMOS transistor N10 is the fourth control terminal of the inverter, a gate of the fourth PMOS transistor P4 is the fifth control terminal of the inverter, a gate of the fifth PMOS transistor P5 is the sixth control terminal of the inverter, a gate of the sixth PMOS transistor P6 is the seventh control terminal of the inverter, a gate of the seventh PMOS transistor P7 is the eighth control terminal of the inverter, and the power supply is accessed to a source of the third PMOS transistor P3, a source of the eighth PMOS transistor P8, a source of the ninth PMOS transistor P9, a source of the tenth PMOS transistor P10 and a source of the eleventh PMOS transistor P11. When the true random number generator works, if the first clock signal CLK1 is at a low level, the first PMOS transistor P1 and the second PMOS transistor P2 are turned on, the first NMOS transistor N1 is turned off, and at this moment, the voltage of a connection node of the drain of the first PMOS transistor P1, the input terminal of the first D flip-flop D1, the output terminal of the first inverter I1 and the input terminal of the second inverter I2. and the voltage of a connection node of the drain of the second PMOS transistor P2, the input terminal of the second D flip-flop D2, the output terminal of the second inverter I2 and the input terminal of the first inverter I1 are increased by the first PMOS transistor P1 and the second PMOS transistor P2 to the power voltage; if the first clock signal CLK1 is at a high level, the first PMOS transistor P1 and the second PMOS transistor P2 are turned off, the first NMOS transistor N1 is turned on, at this moment, the voltage of the connection node of the drain of the first PMOS transistor P1, the input terminal of the first D flip-flop D1, the output terminal of the first inverter I1 and the input terminal of the second inverter I2 and the voltage of the connection node of the drain of the second PMOS transistor P2, the input terminal of the second D flip-flop D2, the output terminal of the second inverter I2 and the input terminal of the first inverter I1 start to be decreased by the first NMOS transistor N1, and accordingly, the second D flip-flop D2 acquires and generates an original random sequence and then outputs the original random sequence.

In this embodiment, the monitoring module and the post-processing module are mature products in the art.

Embodiment 2

This embodiment is basically the same as embodiment 1 and differs from embodiment 1 in the following aspects: in this embodiment, the width-to-length ratio of the second NMOS transistor N2 is 10, the width-to-length ratio of the third NMOS transistor N3 is 0.3, the width-to-length ratio of the fourth NMOS transistor N4 is 0.4, the width-to-length ratio of the fifth transistor N5 is 0.8, the width-to-length ratio of the sixth NMOS transistor N6 is 1.6, the width-to-length ratio of the seventh NMOS transistor N7 is 0.3, the width-to-length ratio of the eighth NMOS transistor N8 is 0.4, the width-to-length ratio of the ninth NMOS transistor N9 is 0.8, the width-to-length ratio of the tenth NMOS transistor N10 is 1.6, the width-to-length ratio of the third PMOS transistor P3 is 15, the width-to-length ratio of the fourth PMOS transistor P4 is 0.4, the width-to-length ratio of the fifth PMOS transistor P5 is 0.5, the width-to-length ratio of the sixth PMOS transistor P6 is 1, the width-to-length ratio of the seventh PMOS transistor P7 is 2, the width-to-length ratio of the eighth PMOS transistor P8 is 0.4, the width-to-length ratio of the ninth PMOS transistor P9 is 0.5, the width-to-length ratio of the tenth PMOS transistor P10 is 1, and the width-to-length ratio of the eleventh PMOS transistor P11 is 2.

Figure 6:
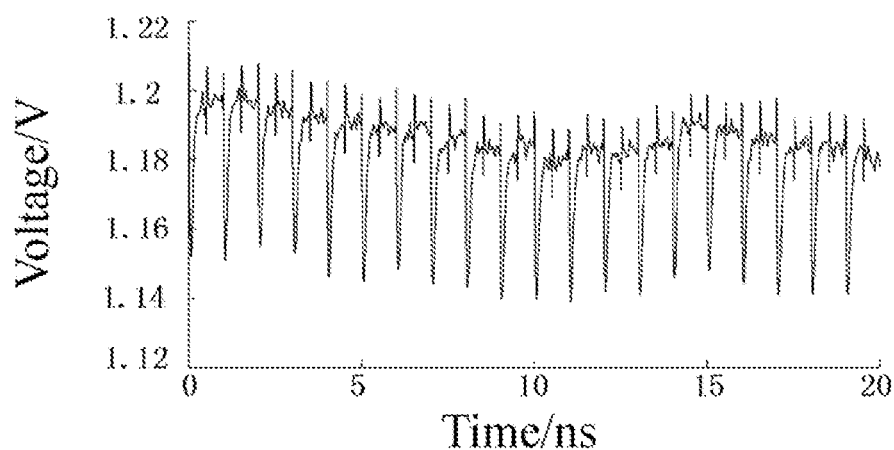
FIG. 6 is a voltage oscillogram of connection node a in an inverter I0 of the existing true random number generator when a fourth 4-bit parallel control signal pconf1 meets pconf1=0000.

The advantages of the true random number generator of the invention over the existing true random number generator are verified below through simulation experiments. FIG. 6 is a voltage oscillogram of connection node a in an inverter I0 of the existing true random number generator when a fourth 4-bit parallel control signal pconf1 meets pconf1=0000, FIG. 7 is a is a voltage oscillogram of connection node a in the inverter I1 of the existing true random number generator when the fourth 4-bit parallel control signal pconf1 meets pconf1=0000, FIG. 8 is an oscillogram of a random sequence output by the existing true random number generator when the fourth 4-bit parallel control signal pconf1 meets pconf1=0000, FIG. 9 is a voltage oscillogram of connection node a in an inverter I0 of the true random number generator of the invention when the fourth 4-bit parallel control signal pconf1 meets pconf1=0000, FIG. 10 is a voltage oscillogram of connection node a in an inverter I1 of the true random number generator of the invention when the fourth 4-bit parallel control signal pconf1 meets pconf1=0000, and FIG. 11 is an oscillogram of a random sequence output by the true random number generator of the invention when the fourth 4-bit parallel control signal pconf1 meets pconf1=0000.

Figure 7:
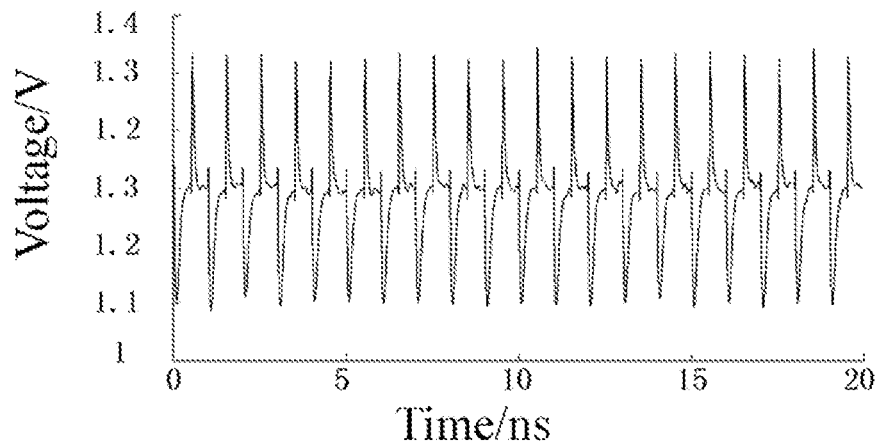
FIG. 7 is a is a voltage oscillogram of connection node a in the inverter I1 of the existing true random number generator when the fourth 4-bit parallel control signal pconf1 meets pconf1=0000.
Figure 8:
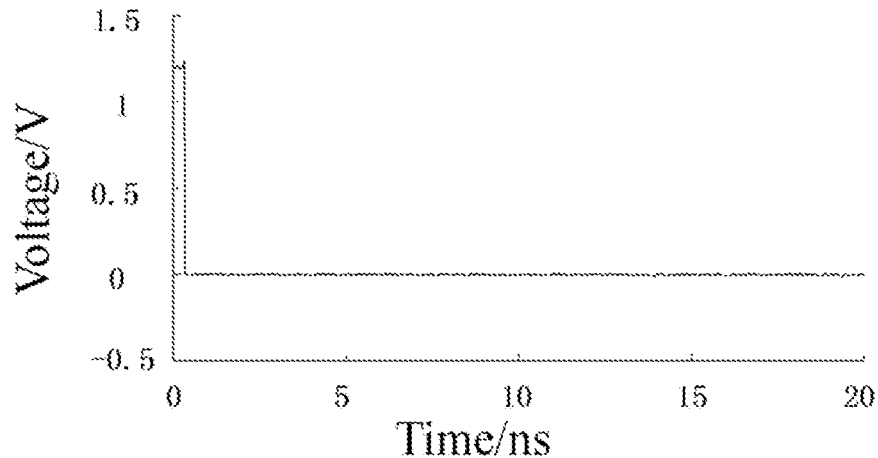
FIG. 8 is an oscillogram of a random sequence output by the existing true random number generator when the fourth 4-bit parallel control signal pconf1 meets pconf1=0000.

As can be seen from FIGS. 6-8, in the existing true random number generator, when the fourth 4-bit parallel control signal pconf1 meets pconf1=0000, the voltage of a connection node between the drain of the fourth PMOS transistor P4 and the source of the eighth PMOS transistor P8, the voltage of a connection node between the drain of the fifth PMOS transistor P5 and the source of the ninth PMOS transistor P9, the voltage of a connection node between the drain of the sixth PMOS transistor P6 and the source of the tenth PMOS transistor P10 and the voltage of a connection node between the drain of the seventh PMOS transistor P7 and the source of the eleventh PMOS transistor P11 in the second inverter are higher than the voltage of a connection node between the drain of the fourth PMOS transistor P4 and the source of the eighth PMOS transistor P8, the voltage of a connection node between the drain of the fifth PMOS transistor P5 and the source of the ninth PMOS transistor P9, the voltage of a connection node between the drain of the sixth PMOS transistor P6 and the source of the tenth PMOS transistor P10 and the voltage of a connection node between the drain of the seventh PMOS transistor P7 and the source of the eleventh PMOS transistor P11 in the first inverter under the capacitive coupling effect, so that the capacity of the second inverter to pull up node b (the input terminal of the second D flip-flop) is improved, and an actual sampling result has a larger probability to output '1', which goes against the theoretical sampling result having a larger probability to output '0'.

Figure 9:
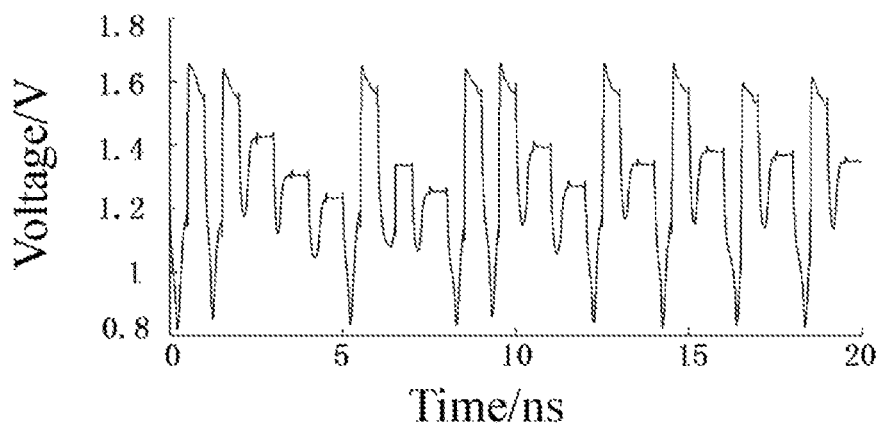
FIG. 9 is a voltage oscillogram of connection node a in an inverter I0 of the true random number generator of the invention when the fourth 4-bit parallel control signal pconf1 meets pconf1=0000.
Figure 10:
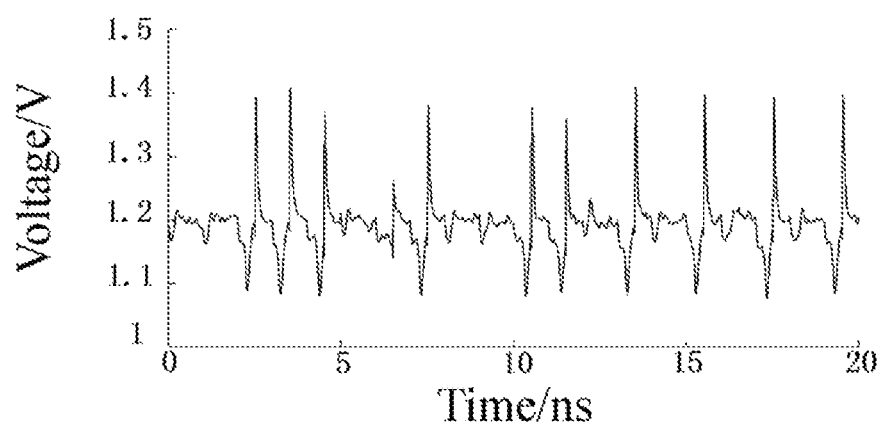
FIG. 10 is a voltage oscillogram of connection node a in an inverter I1 of the true random number generator of the invention when the fourth 4-bit parallel control signal pconf1 meets pconf1=0000.
Figure 11:
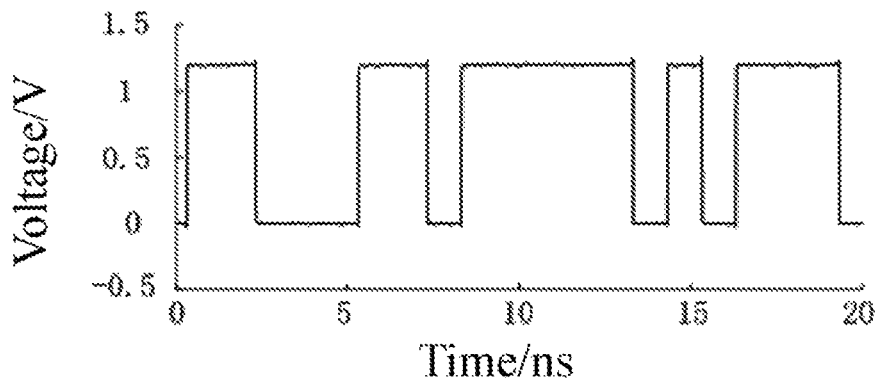
FIG. 11 is an oscillogram of a random sequence output by the true random number generator of the invention when the fourth 4-bit parallel control signal pconf1 meets pconf1=0000.

As can be seen from FIGS. 9-11, in the invention, when the fourth 4-bit parallel control signal pconf1 meets pconf1=0000, the voltage of a connection node between the drain of the fourth PMOS transistor P4 and the source of the eighth PMOS transistor P8, the voltage of a connection node between the drain of the fifth PMOS transistor P5 and the source of the ninth PMOS transistor P9, the voltage of a connection node between the drain of the sixth PMOS transistor P6 and the source of the tenth PMOS transistor P10 and the voltage of a connection node between the drain of the seventh PMOS transistor P7 and the source of the eleventh PMOS P11 in the second inverter are lower than the voltage of a connection node between the drain of the fourth PMOS transistor P4 and the source of the eighth PMOS transistor P8, the voltage of a connection node between the drain of the fifth PMOS transistor P5 and the source of the ninth PMOS transistor P9, the voltage of a connection node between the drain of the sixth PMOS transistor P6 and a source of the tenth PMOS transistor P10 and the voltage of a connection node between a drain of the seventh PMOS transistor P7 and the eleventh PMOS transistor P11 in the first inverter, so that the capacity of the second inverter to pull up node b (the input terminal of the second D flip-flop) is lower than the capacity of the first inverter, and accordingly, the actual sampling result has a larger probability to output '0' and accords with the theoretical sampling result. Thus, the true random number generator of the invention eliminates the capacitive coupling effects and is able to output results consistent with the theoretical result, and the randomness of the true random number generator is improved.

What is claimed is:
1. A true random number generator with stable node voltage, comprising:
    a loop control logic; and
    two inverters identical in structure,
    wherein the loop control logic has an input terminal, a first output terminal, a second output terminal, a third output terminal and a fourth output terminal; the first output terminal of the loop control logic is used for outputting a first 4-bit parallel control signal, the second output terminal of the loop control logic is used for outputting a second 4-bit parallel control signal, the third output terminal of the loop control logic is used for outputting a third 4-bit parallel control signal, and the fourth output terminal of the loop control logic is used for outputting a fourth 4-bit parallel control signal; each said inverter has an input terminal, an output terminal, a discharging terminal, a first control terminal, a second control terminal, a third control terminal, a fourth control terminal, a fifth control terminal, a sixth control terminal, a seventh control terminal and an eighth control terminal, wherein the two inverters are called a first inverter and a second inverter, wherein a first bit of the first 4-bit parallel control signal is accessed to the first control terminal of the first inverter, a second bit of the first 4-bit parallel control signal is accessed to the second control terminal of the first inverter, a third bit of the first 4-bit parallel control signal is accessed to the third control terminal of the first inverter, a fourth bit of the first 4-bit parallel control signal is accessed to the fourth control terminal of the first inverter;

a first bit of the third 4-bit parallel control signal is accessed to the fifth control terminal of the first inverter, a second bit of the third 4-bit parallel control signal is accessed to the sixth control terminal of the first inverter, a third bit of the third 4-bit parallel control signal is accessed to the seventh control terminal of the first inverter, a fourth bit of the third 4-bit parallel control signal is accessed to the eighth control terminal of the first inverter;

a first bit of the second 4-bit parallel control signal is accessed to the first control terminal of the second inverter, a second bit of the second 4-bit parallel control signal is accessed to the second control terminal of the second inverter, a third bit of the second 4-bit parallel control signal is accessed to the third control terminal of the second inverter, a fourth bit of the second 4-bit parallel control signal is accessed to the fourth control terminal of the second inverter;

a first bit of the fourth 4-bit parallel control signal is accessed to the fifth control terminal of the second inverter, a second bit of the fourth 4-bit parallel control signal is accessed to the sixth control terminal of the second inverter, a third bit of the fourth 4-bit parallel control signal is accessed to the seventh control terminal of the second inverter, and a fourth bit of the fourth 4-bit parallel control signal is accessed to the eighth control terminal of the second inverter;

the true random number generator further comprises two D flip-flops identical in structure, a first PMOS transistor, a second PMOS transistor, a first NMOS transistor, a monitoring module and a post-processing module;

each said D flip-flop has a clock terminal, an input terminal and an output terminal, the monitoring module and the post-processing module each have an input terminal and an output terminal, and the two D flip-flops are called a first D flip-flop and a second D flip-flop;

a power supply is accessed to a source of the first PMOS transistor and a source of the second PMOS transistor;

a gate of the first PMOS transistor, a gate of the second PMOS transistor and a gate of the first NMOS transistor are connected, and a corresponding connecting terminal is a first clock terminal of the true random number generator and allows a first clock signal to be accessed thereto; a drain of the first PMOS transistor, the input terminal of the first D flip-flop, the output terminal of the first inverter and the input terminal of the second inverter are connected; a drain of the second PMOS transistor, the input terminal of the second D flip-flop, the input terminal of the first inverter and the output terminal of the second inverter are connected; the discharging terminal of the first inverter, the dis-charging terminal of the second inverter and a drain of the first NMOS transistor are connected; a source of the first NMOS transistor is grounded; the input terminal of the first D flip-flop is an input terminal of the true random number generator; the clock terminal of the first D flip-flop and the clock terminal of the second D flip-flop are connected, and a corresponding connecting terminal is a second clock terminal of the true random number generator and allows a second clock signal to be accessed thereto; a cycle and an amplitude of the second clock signal are the same as those of the first clock signal, and a phase of the second clock signal is delayed by a quarter of the cycle with respect to the first clock signal; the output terminal of the second D flip-flop is connected to the input terminal of the post-processing module and the input terminal of the monitoring module; the output terminal of the monitoring module is connected to the input terminal of the loop control logic; the output terminal of the second D flip-flop is used for generating an original random sequence;

the monitoring module is used for periodically acquiring 4-bit data in the original random sequence, analyzing and calculating the probabilities of 0 and 1 in the 4-bit data to obtain a probability result and then sending the probability result to the loop control logic;

the loop control logic generates corresponding control signals at the first output terminal, the second output terminal, the third output terminal and the fourth output terminal according to the probability result sent from the monitoring module to regulate the driving capacity of the first inverter and the second inverter;

the original random sequence input to the post-processing module is subjected to bitxor processing by the post-processing module and is then output;

each said inverter comprises a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a tenth PMOS transistor and an eleventh PMOS transistor;

a gate of the second NMOS transistor, a gate of the third NMOS transistor, a gate of the fourth NMOS transistor, a gate of the fifth NMOS transistor, a gate of the sixth NMOS transistor, a gate of the third PMOS transistor, a gate of the eighth PMOS transistor, a gate of the ninth PMOS transistor, a gate of the tenth PMOS transistor and a gate of the eleventh PMOS transistor are connected, and a corresponding connecting terminal is the input terminal of the inverter;

a drain of the second NMOS transistor, a drain of the seventh NMOS transistor, a drain of the eighth NMOS transistor, a drain of the ninth NMOS transistor, a drain of the tenth NMOS transistor, a drain of the third PMOS transistor, a drain of the fourth PMOS transistor, a drain of the fifth PMOS transistor, a drain of the sixth PMOS transistor and a drain of the seventh PMOS transistor are connected, and a corresponding connecting terminal is the output terminal of the inverter;

a source of the second NMOS transistor, a source of the third NMOS transistor, a source of the fourth NMOS transistor, a source of the fifth NMOS transistor and a source of the sixth NMOS transistor are connected, and a corresponding connecting terminal is the discharging terminal of the inverter;

a drain of the third NMOS transistor is connected to a source of the seventh NMOS transistor, a drain of the fourth NMOS transistor is connected to a source of the eighth NMOS transistor, a drain of the fifth NMOS transistor is connected to a source of the ninth NMOS transistor, a drain of the sixth NMOS transistor is connected to a source of the tenth NMOS transistor;

a source of the fourth PMOS transistor is connected to a drain of the eighth PMOS transistor, a source of the fifth PMOS transistor is connected to a drain of the ninth PMOS transistor, a source of the sixth PMOS transistor is connected to a drain of the tenth PMOS transistor, a source of the seventh PMOS transistor is connected to a drain of the eleventh PMOS transistor;

a gate of the seventh NMOS transistor is the first control terminal of the inverter, a gate of the eighth NMOS transistor is the second control terminal of the inverter, a gate of the ninth NMOS transistor is the third control terminal of the inverter, a gate of the tenth NMOS transistor is the fourth control terminal of the inverter, a gate of the fourth PMOS transistor is the fifth control terminal of the inverter, a gate of the fifth PMOS transistor is the sixth control terminal of the inverter, a gate of the sixth PMOS transistor is the seventh control terminal of the inverter, a gate of the seventh PMOS transistor is the eighth control terminal of the inverter; and the power supply is accessed to a source of the third PMOS transistor, a source of the eighth PMOS transistor, a source of the ninth PMOS transistor, a source of the tenth PMOS transistor and a source of the eleventh PMOS transistor;

when the true random number generator works, if the first clock signal is at a low level, the first PMOS transistor and the second PMOS transistor are turned on, the first NMOS transistor is turned off, and at this moment, the voltage of a connection node of the drain of the first PMOS transistor, the input terminal of the first D flip-flop, the output terminal of the first inverter and the input terminal of the second inverter and the voltage of a connection node of the drain of the second PMOS transistor, the input terminal of the second D flip-flop, the output terminal of the second inverter and the input terminal of the first inverter are increased by the first PMOS transistor and the second PMOS transistor to a power voltage; if the first clock signal is at a high level, the first PMOS transistor and the second PMOS transistor are turned off, the first NMOS transistor is turned on, at this moment, the voltage of the connection node of the drain of the first PMOS transistor, the input terminal of the first D flip-flop, the output terminal of the first inverter and the input terminal of the second inverter and the voltage of the connection node of the drain of the second PMOS transistor, the input terminal of the second D flip-flop, the output terminal of the second inverter and the input terminal of the first inverter start to be decreased by the first NMOS transistor, and accordingly, the second D flip-flop acquires and generates an original random sequence and then outputs the original random sequence.

2. The true random number generator with stable node voltage according to claim 1, wherein the second NMOS transistor has a width-to-length ratio of 10, the third NMOS transistor has a width-to-length ratio of 0.3, the fourth NMOS transistor has a width-to-length ratio of 0.4, the fifth transistor has a width-to-length ratio of 0.8, the sixth NMOS transistor has a width-to-length ratio of 1.6, the seventh NMOS transistor has a width-to-length ratio of 0.3, the eighth NMOS transistor has a width-to-length ratio of 0.4, the ninth NMOS transistor has a width-to-length ratio of 0.8, the tenth NMOS transistor has a width-to-length ratio of 1.6, the third PMOS transistor has a width-to-length ratio of 15, the fourth PMOS transistor has a width-to-length ratio of 0.4, the fifth PMOS transistor has a width-to-length ratio of 0.5, the sixth PMOS transistor has a width-to-length ratio of 1, the seventh PMOS transistor has a width-to-length ratio of 2, the eighth PMOS transistor has a width-to-length ratio of 0.4, the ninth PMOS transistor has a width-to-length ratio of 0.5, the tenth PMOS transistor has a width-to-length ratio of 1, and the eleventh PMOS transistor has a width-to-length ratio of 2.

* * * * *